(12) United States Patent
Akamatsu et al.

(10) Patent No.: US 9,153,791 B2
(45) Date of Patent: Oct. 6, 2015

(54) ORGANIC EL DISPLAY PANEL

(75) Inventors: Kaori Akamatsu, Osaka (JP); Kenichi Nendai, Hyogo (JP); Seiji Nishiyama, Osaka (JP); Naoko Mizusaki, Osaka (JP)

(73) Assignee: JOLED INC, Tokyo (JP)

( * ) Notice: Subject to any disclaimer, the term of this patent is extended or adjusted under 35 U.S.C. 154(b) by 0 days.

(21) Appl. No.: 13/978,601

(22) PCT Filed: Dec. 22, 2011

(86) PCT No.: PCT/JP2011/007192
§ 371 (c)(1),
(2), (4) Date: Jul. 8, 2013

(87) PCT Pub. No.: WO2013/093974
PCT Pub. Date: Jun. 27, 2013

(65) Prior Publication Data
US 2013/0285034 A1   Oct. 31, 2013

(51) Int. Cl.
*H01L 29/08* (2006.01)
*H01L 51/50* (2006.01)
*H05B 33/22* (2006.01)
(Continued)

(52) U.S. Cl.
CPC ........ *H01L 51/5056* (2013.01); *H01L 27/3211* (2013.01); *H01L 27/3246* (2013.01); *H05B 33/10* (2013.01); *H05B 33/22* (2013.01); *H01L 2251/5315* (2013.01)

(58) Field of Classification Search
CPC .................................................. H01L 27/3246
USPC ................... 257/40, 88, E51.026; 438/29, 99
See application file for complete search history.

(56) References Cited

U.S. PATENT DOCUMENTS

| 5,443,922 A | 8/1995 | Nishizaki et al. |
| 2004/0119066 A1* | 6/2004 | Han et al. .................. 257/40 |
| 2007/0132356 A1 | 6/2007 | Hashimoto et al. |

(Continued)

FOREIGN PATENT DOCUMENTS

| JP | 05-163488 | 6/1993 |
| JP | 2007-188862 | 7/2007 |

(Continued)

OTHER PUBLICATIONS

U.S. Appl. No. 13/982,007 to Kaori Akamatsu et al., filed Jul. 26, 2013.

(Continued)

*Primary Examiner* — Matthew Gordon
(74) *Attorney, Agent, or Firm* — Greenblum & Bernstein, P.L.C.

(57) ABSTRACT

An organic EL display panel offering improved luminance includes: a substrate; pixel electrodes arranged in rows and columns; an insulating film coating the confronting edges of pixel electrodes adjacent in a column direction; banks each elongated in the column direction over a gap between pixel electrodes adjacent in the row direction; a hole transport layer in a gap between the banks; an organic light-emitting layer over the hole transport layer; and a common electrode over the organic light-emitting layer. Light is emitted from a first light-emitting portion and second light-emitting portions of the light-emitting layer. The first light-emitting portion is a portion above the pixel electrodes excluding where the insulating film is disposed. The second light-emitting portions are portions above both the pixel electrodes and the insulating film.

5 Claims, 11 Drawing Sheets

(51) Int. Cl.
*H01L 27/32* (2006.01)
*H05B 33/10* (2006.01)

(56) References Cited

U.S. PATENT DOCUMENTS

| | | |
|---|---|---|
| 2007/0188584 A1 | 8/2007 | Nakamura et al. |
| 2007/0241665 A1 | 10/2007 | Sakanoue et al. |
| 2009/0160322 A1* | 6/2009 | Yoshida et al. ............... 313/504 |
| 2010/0102397 A1* | 4/2010 | Park et al. .................... 257/392 |
| 2010/0181559 A1* | 7/2010 | Nakatani et al. ............... 257/40 |
| 2012/0132935 A1 | 5/2012 | Isobe et al. |

FOREIGN PATENT DOCUMENTS

| | | |
|---|---|---|
| JP | 2007-210277 | 8/2007 |
| JP | 2007-287558 | 11/2007 |
| JP | 2008-091070 | 4/2008 |
| JP | 2009-200049 | 9/2009 |
| WO | 2009/087966 | 7/2009 |
| WO | 2011/013714 | 2/2011 |

OTHER PUBLICATIONS

Search report from Japan, mail date is Dec. 22, 2011.

* cited by examiner

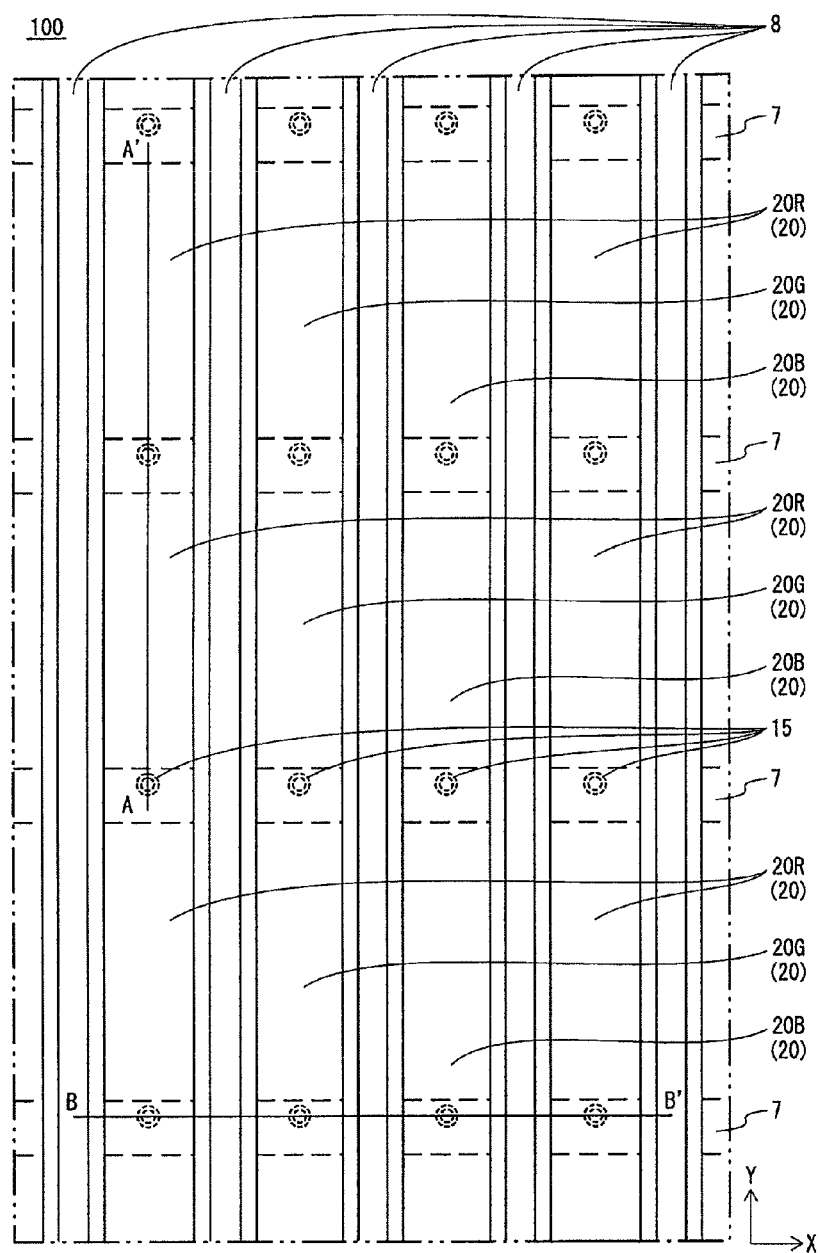

A-A' cross section

B-B' cross section

FIG. 4A
10nm
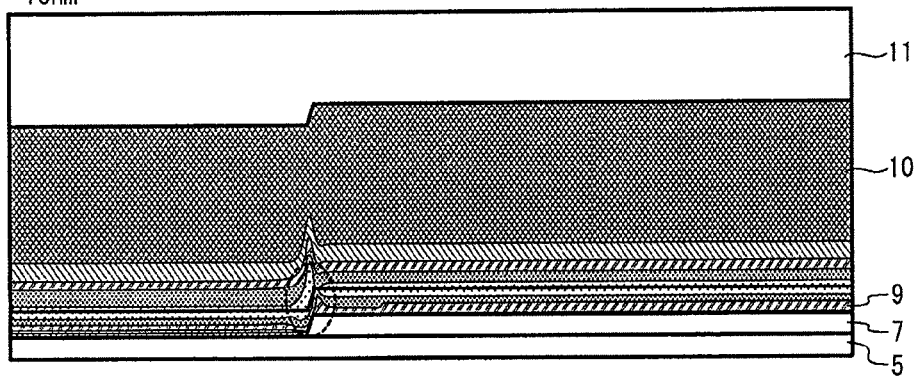
FIG. 4B
20nm
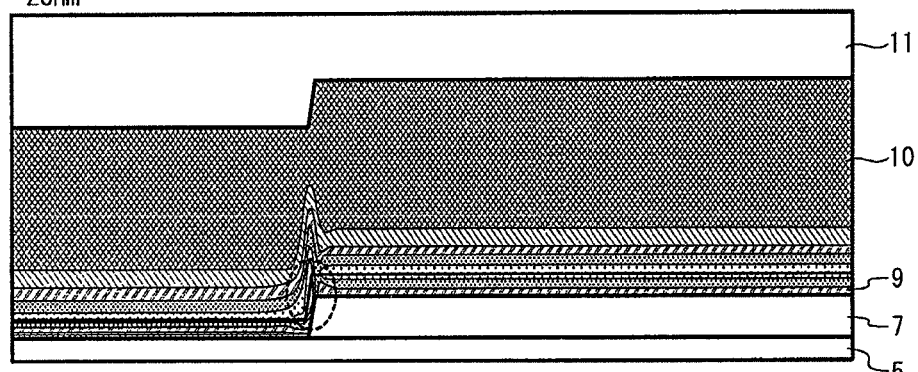
FIG. 4C
30nm
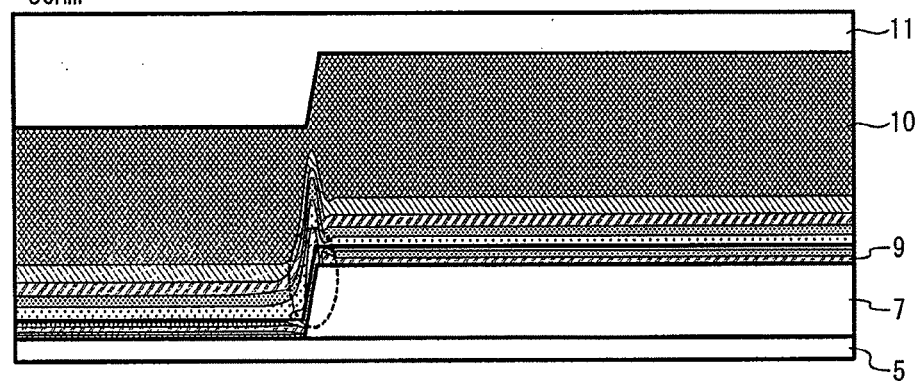
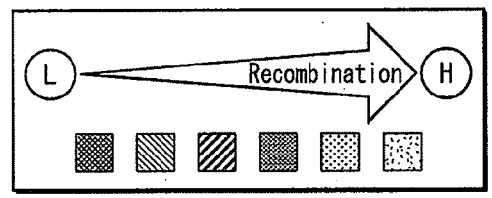

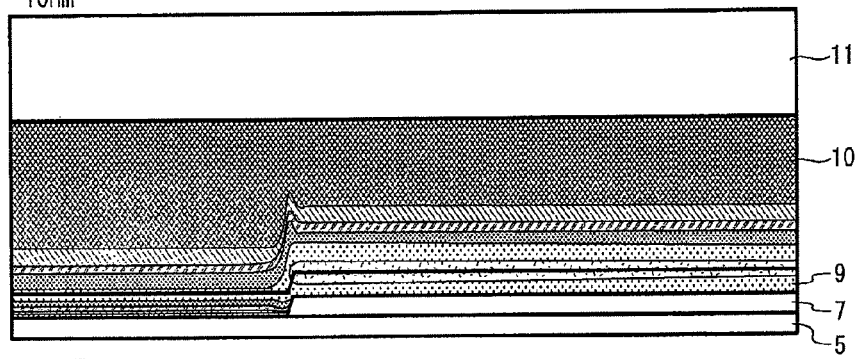
FIG. 5A
10nm
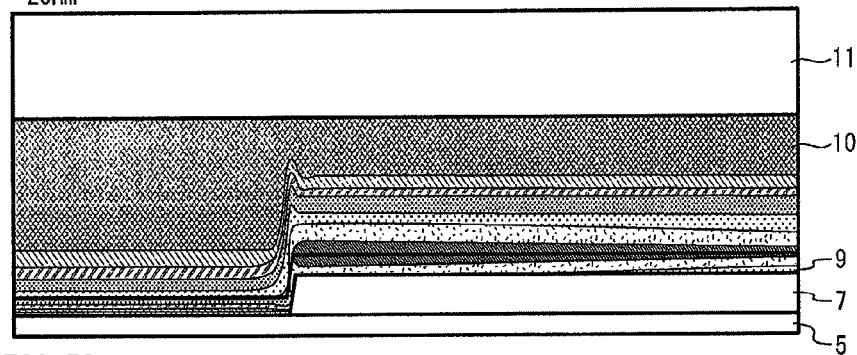
FIG. 5B
20nm
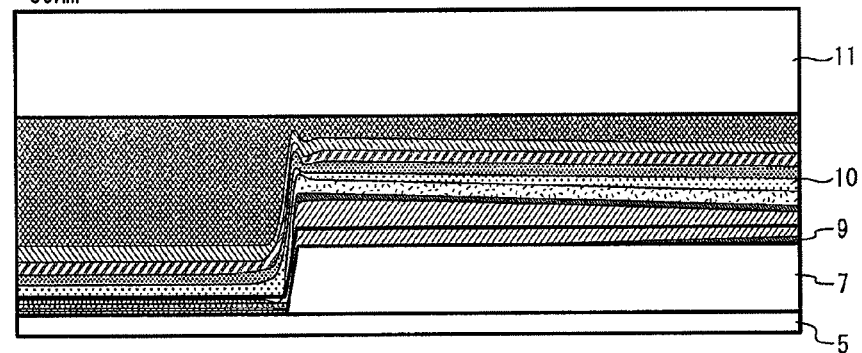
FIG. 5C
30nm
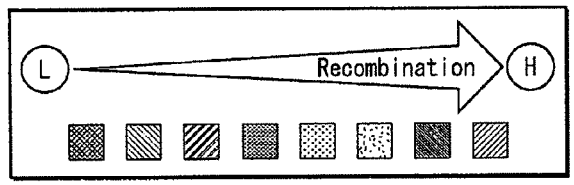

FIG. 6
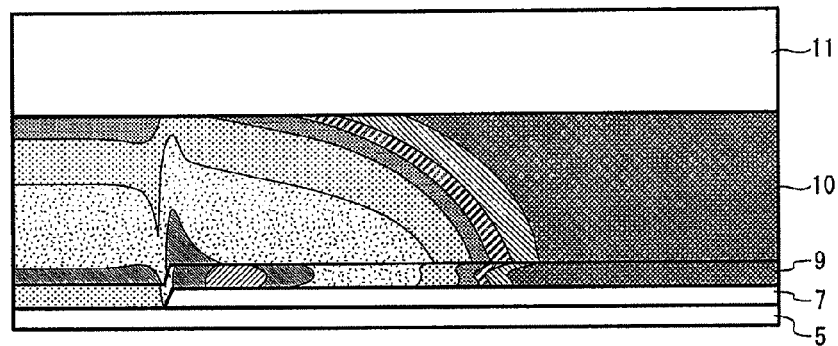
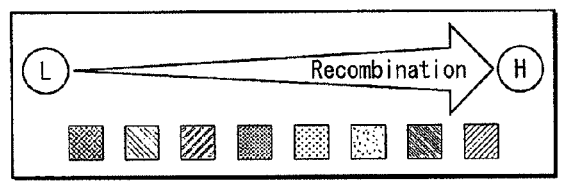

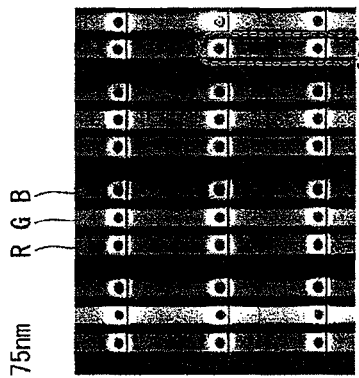
FIG. 7C
75nm
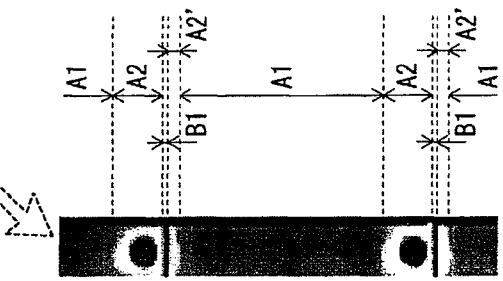
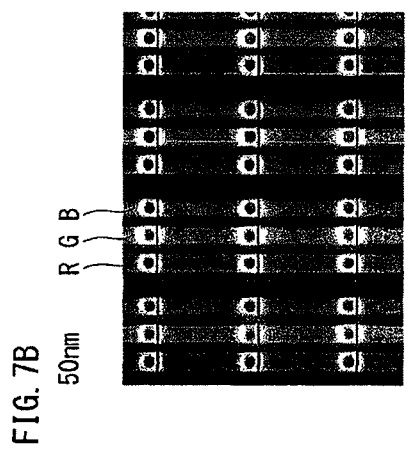
FIG. 7B
50nm
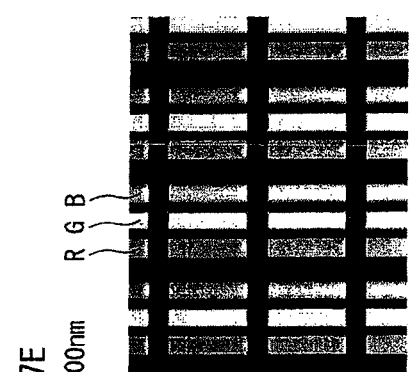
FIG. 7E
300nm
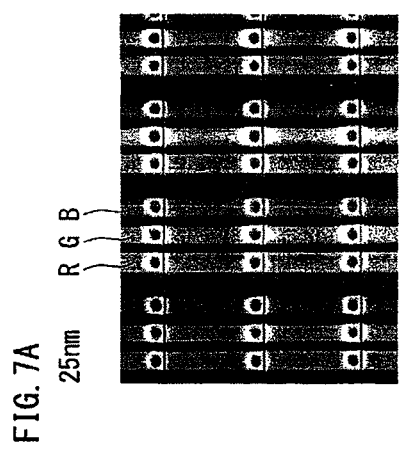
FIG. 7A
25nm
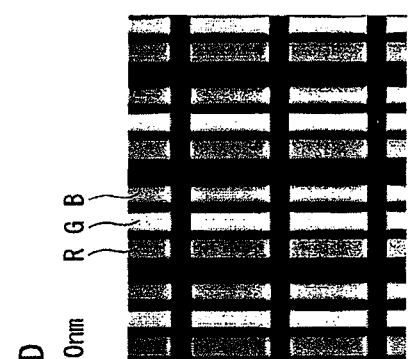
FIG. 7D
100nm FIG. 8
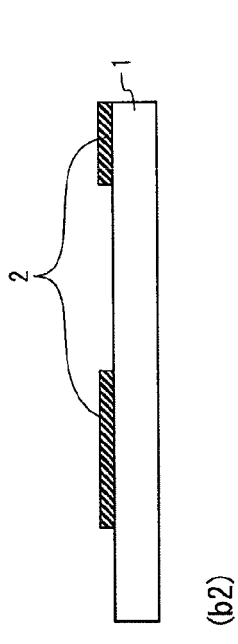
(a1)
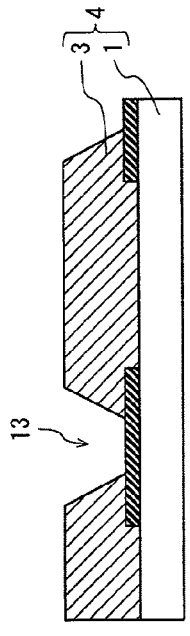
(b1)
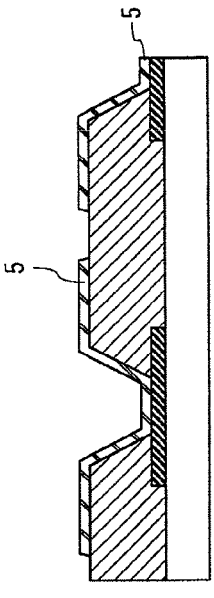
(c1)
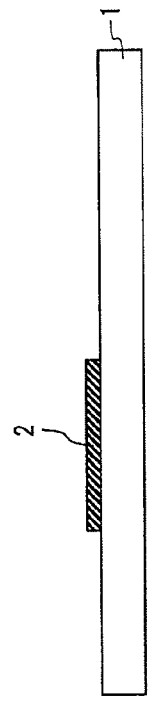
(a2)
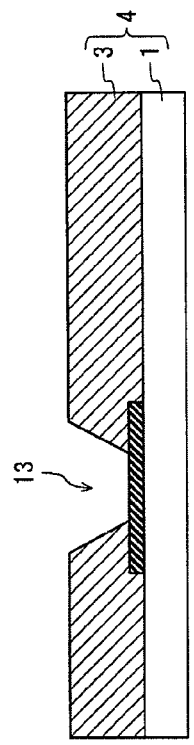
(b2)
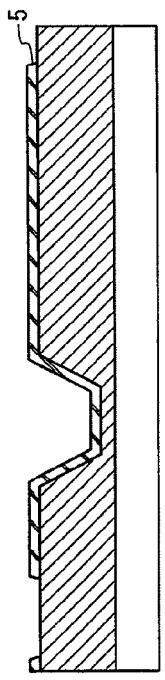
(c2)

ary inventionrelates to the luminance display

ORGANIC EL DISPLAY PANEL

TECHNICAL FIELD

The present invention relates to a luminescence display panel with an array of light-emitting elements, and in particular relates to an organic EL display panel with organic electroluminescence elements (hereinafter, "organic EL elements") arranged in rows and columns.

BACKGROUND ART

In recent years, progress is being made in research and development of organic EL elements, which are light-emitting elements that use electroluminescence of a solid fluorescent material. Because organic EL elements are self-luminous elements, an organic EL display panel having such organic EL elements arranged in rows and columns on a TFT substrate offers advantages including high visibility and excellent shock resistance. An organic EL element is fabricated by laminating layers including an organic light-emitting layer between a pixel electrode (anode) and a common electrode (cathode), the organic light-emitting layer emitting light as a result of recombination of carriers (holes and electrons).

Examples of methods for manufacturing such organic light-emitting layers include a vapor deposition method and a printing method. Especially, when an inkjet method, which is a type of printing methods, is employed to form organic light-emitting layers, it is necessary to provide barriers (banks) formed, for example, from an insulating material between adjacent pixels in order to prevent ink drops from mixing into ink drops of a different color dripped into adjacent pixels. One method for forming banks is a line-bank method according to which a plurality of banks are formed in parallel lines so that organic light-emitting layers are partitioned into stripes (see Patent Literature 1, for example). Another method is a pixel-bank method according to which a grid-like (lattice-like) bank is formed to surround individual pixels.

FIG. 11 is a schematic sectional view showing the structure of an organic EL display panel 900 having banks formed by a typical line-bank method. Disposed on the upper surface of a substrate 91 are SD electrodes (source-drain electrodes) 92 of thin-film transistors that are for driving the organic EL elements. In addition, an interlayer insulation film 93 is disposed to coat the SD electrodes 92. Pixel electrodes 94 are disposed over (i.e., on or above) the interlayer insulation film 93 and connected to the SD electrodes 92 via contact holes 95 formed in the interlayer insulation film 93. Pixel-defining layers 96 are disposed over the pixel electrodes 94 in a manner to coat the edges of different pixel electrodes 94, the edges facing in the lateral direction in the figure. Over the pixel electrodes 94 and the pixel-defining layers 96, organic light-emitting layers 97 and a common electrode 98 are layered in order. In the organic EL display panel 900 having the above structure, portions of the organic light-emitting layers 97 constitute light-emitting portions are those located above the regions A9. Each region A9 is a region of the pixel electrode 94 excluding where the pixel-defining layer 96 is disposed.

CITATION LIST

Patent Literature

[Patent Literature 1]
Japanese Patent Application Publication No. 2009-200049

SUMMARY OF INVENTION

Technical Problem

There is a demand for further improving the luminance (i.e., brightness) of organic EL display panels.

The present invention is made in view of the above demand and aims to provide an organic EL display panel which is enabled to offer improved luminance.

Solution to Problem

According to one aspect of the present invention, an organic EL display panel includes: a substrate; a plurality of pixel electrodes arranged in rows and columns over the substrate; an insulating film elongated in a row direction over the pixel electrodes, the insulating film having a portion recessed to coat edges of pixel electrodes adjacent in a column direction, the edges facing each other in the column direction; a plurality of banks each elongated in the column direction over a region corresponding to a gap between pixel electrodes adjacent in the row direction; a hole transport layer disposed in a gap between the banks; an organic light-emitting layer disposed over the hole transport layer in the gap between the banks; and a common electrode disposed over the organic light-emitting layer. The organic EL display panel emits light from a first light-emitting portion and a second light-emitting portion of the light-emitting layer. The first light-emitting portion is a portion, of the light-emitting layer, above the pixel electrodes excluding where the insulating film is disposed. The second light-emitting portion is a portion, of the light-emitting layer, above both the pixel electrodes and the insulating film.

Advantageous Effects of Invention

In the organic EL display panel according to the one aspect of the present invention, light is emitted not only from the first light-emitting portions which have conventionally contributed to light emission but also from the second light-emitting portions which have not conventionally contributed to light emission. The second light-emitting portions are portions of the organic light-emitting layers located above both the pixel electrodes and the insulating films. As a consequence, the light-emitting surface of the organic EL display panel increases, which in turn improves the luminance of the organic EL display panel.

The present invention therefore achieves increased luminance intensity.

BRIEF DESCRIPTION OF DRAWINGS

FIG. 1 is a plan view schematically showing the structure of an organic EL display panel 100 according to an embodiment.

FIGS. 4A, 4B, and 4C are views each showing a simulation result of distribution of charge recombination in the respective layers of the organic EL display panel 100.

FIGS. 5A, 5B, and 5C are views each showing a simulation result of distribution of charge recombination in the respective layers of the organic EL display panel 100.

FIG. 6 is a view showing a simulation result of distribution of charge recombination in layers of an organic EL display panel that is a comparative example.

FIGS. 7A-7E are views showing results of light emission experiments conducted on different test panels with pixel-defining layers of different thicknesses.

FIG. 8 is a view showing one exemplary manufacturing method for the organic EL display panel 100.

DESCRIPTION OF EMBODIMENTS

<<Outline of Aspect of the Present Invention>>

According to one aspect of the present invention, an organic EL display panel includes: a substrate; a plurality of pixel electrodes arranged in rows and columns over the substrate; an insulating film elongated in a row direction over the pixel electrodes, the insulating film having a portion recessed to coat edges of pixel electrodes adjacent in a column direction, the edges facing each other in the column direction; a plurality of banks each elongated in the column direction over a region corresponding to a gap between pixel electrodes adjacent in the row direction; a hole transport layer disposed in a gap between the banks; an organic light-emitting layer disposed over the hole transport layer in the gap between the banks; and a common electrode disposed over the organic light-emitting layer. The organic EL display panel emits light from a first light-emitting portion and a second light-emitting portion of the light-emitting layer. The first light-emitting portion is a portion, of the light-emitting layer, above the pixel electrodes excluding where the insulating film is disposed. The second light-emitting portion is a portion, of the light-emitting layer, above both the pixel electrodes and the insulating film.

According to one specific mode of the aspect of the present invention, the insulating film contains at least one selected from a group consisting of silicon oxide, silicon nitride and silicon oxynitride, and measures at least 10 nm and at most 75 nm in thickness.

According to one specific mode of the aspect of the present invention, a hole mobility of the hole transport layer is at least $10^3$ times and at most $10^5$ times a hole mobility of the organic light-emitting layer.

According to one specific mode of the aspect of the present invention, an amount of light emitted from the second light-emitting portion is at least 1/10 of an amount of light emitted from the first light-emitting portion.

Modes of Embodiments

[Structure of Organic EL Display Panel 100]

Figure 2A:
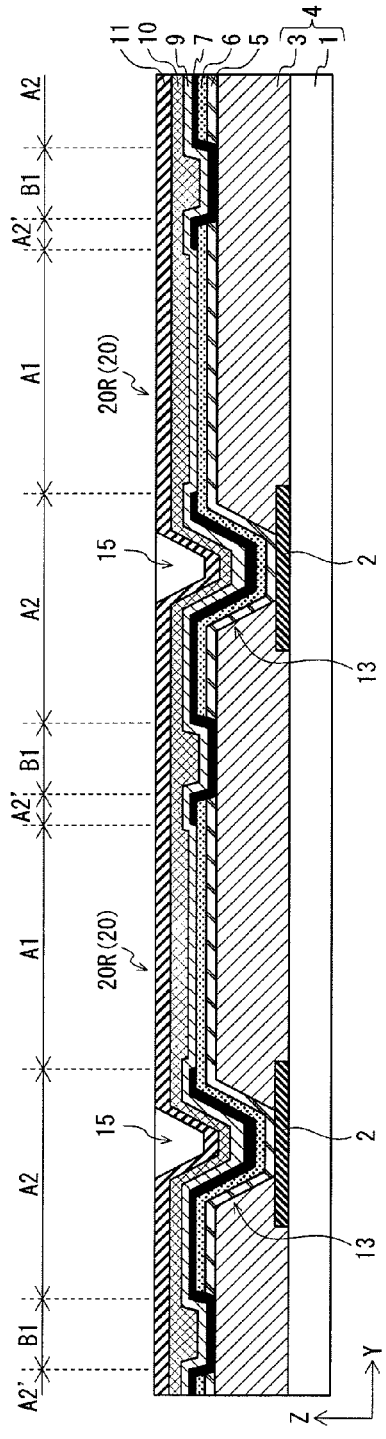
FIG. 2A is a view showing an A-A' cross section of FIG. 1.
Figure 2B:
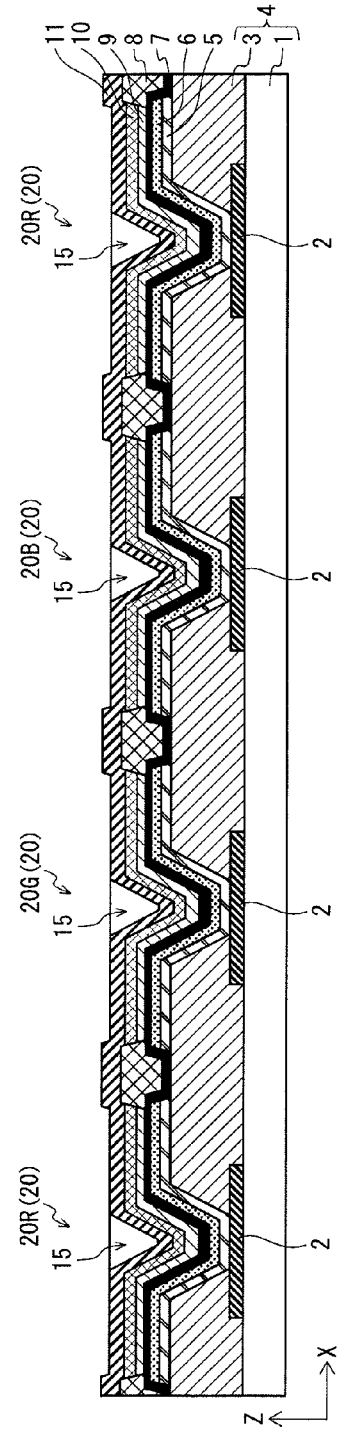
FIG. 2B is a view showing a B-B' cross section of FIG. 1.

FIG. 1 is a plan view schematically showing the structure of an organic EL display panel 100 according to an embodiment. FIG. 2A is a view showing an A-A' cross section (Y-Z cross section) of FIG. 1, and FIG. 2B is a view showing a B-B' cross section (Z-X cross section) of FIG. 1.

The organic EL display panel 100 uses the phenomenon of electroluminescence occurring in organic material and is a top emission type panel. The organic EL display panel 100 includes a plurality of organic EL elements 20 arranged in a rows and columns in x- and y-direction. In FIG. 1, the organic EL elements corresponding to red (R), green (G), and blue (B) are denoted as sub-pixels 20R, 20G, and 20B, respectively. A set of three sub-pixels 20R, 20G, and 20B forms one pixel.

One main feature of the organic EL display panel 100 lies in that the organic EL display panel 100 has first light-emitting portions A1 and second light-emitting portions A2 and A2', as shown in FIG. 2A.

Major components of the organic EL display panel 100 include a TFT substrate 4, pixel electrodes 5, hole injection layers 6, pixel defining layers 7, banks 8, hole transport layers 9, organic light-emitting layers 10, and a common electrode 11.

<TFT Substrate 4>

The TFT substrate 4 is formed from a substrate 1, SD electrodes 2, and an interlayer insulation film 3.

The substrate 1 serves as the base of the organic EL display panel 100 and is formed from an insulating material such as alkalifree glass, soda glass, nonfluorescent glass, phosphate glass, borate glass, quartz, acrylic resin, styrenic resin, polycarbonate resin, epoxy resin, polyethylene, polyester, silicone resin, alumina, or the like.

The SD electrodes 2 formed on the surface of the substrate 1 are source-drain electrodes of TFTs that are for driving the organic EL elements 20 by the active matrix method. The TFTs may be made by using any of the following as a channel material: silicon; oxide semiconductor such as indium gallium zinc oxide; and an organic semiconductor such as pentacene.

The interlayer insulation film 3 is formed from an organic material with excellent insulating properties and covers the TFTs of the substrate 1. Examples of such an organic material include polyimide, polyamide, or acrylic resin. The interlayer insulation film 3 has a plurality of contact holes 13, one for each organic EL element 20, that are recessed in the thickness direction (z direction). Each contact hole 13 is a through hole that is circular at the bottom opening. The SD electrode 2 and the pixel electrode 5 are electrically connected through the contact hole 13.

<Pixel Electrodes 5>

The pixel electrodes (anodes) 5 are formed over the TFT substrate 4. Each pixel electrode 5 is disposed so as to conform to the contact hole 13 formed in the interlayer insulation film 3. The connection between the pixel electrode 5 and the SD electrode 2 is made through the contact hole 13. In the case where the organic EL display panel 100 is a top-emission type as in this embodiment, it is preferable that the pixel electrodes 5 be light-reflective. Examples of suitable materials for the pixel electrodes 5 include APC (alloy of silver, palladium, and copper), ARA (alloy of silver, rubidium, and gold), MoCr (alloy of molybdenum and chromium), and NiCr (alloy of nickel and chromium). The pixel electrodes 5 are arranged in rows and columns in x- and y-direction so as to correspond in position to the organic EL elements 20.

<Hole Injection Layers 6>

Each hole injection layer 6 is formed on one of the pixel electrodes 5. The hole injection layer 6 is provided to facilitate injection of holes from the pixel electrode 5 to the organic light-emitting layer 10 and has a configuration similar to the pixel electrode 5. The hole injection layers 6 may be formed from oxide of silver (Ag), molybdenum (Mo), chromium (Cr), vanadium (V), tungsten (W), nickel (Ni), or iridium (Ir) or from a conductive polymer such as PEDOT (mixture of polythiophene and polystyrene sulfonic acid).

Note that an indium tin oxide (ITO) layer or an indium zinc oxide (IZO) layer may be provided between each pixel electrode 5 and the corresponding hole injection layer 6 for the purpose of strengthening the junction between the respective layers (i.e., to the pixel electrode 5 and the hole injection layer 6).

<Pixel Defining Layer 7>

The pixel defining layers 7 are formed on the hole injection layers 6 to prevent a short circuit between the edge of any pixel electrode 5 and the common electrode 11. The pixel defining layers 7 correspond to insulating films and formed such that each pixel defining layer 7 coats the edges, of the adjacent pixel electrodes 5 in the Y direction, facing each other in the Y direction (i.e., the confronting edges of the pixel electrodes 5 adjacent in the Y direction). More specifically, the pixel defining layers 7 have a liner shape elongated in the X direction and are all equal in width and disposed at an equal pitch. Each pixel defining layer 7 has portions recessed to fill the gap between each two pixel electrodes 5 and between each two hole injection layers 6 adjacent in the Y direction and also has portions recessed to cover the inner surface of the contact holes 13.

In the present embodiment, in order to create the second light-emitting portions A2 and A2', the pixel defining layers 7 are formed from a material having a relative dielectric constant of at least 3.8. For example, the pixel defining layers 7 may be formed from an insulating material, examples of which include silicon oxide (SiO), silicon nitride (SiN), silicon oxynitride (SiON). More preferably, the pixel defining layer 7 may be formed of a high dielectric constant gate insulating film (so called High-k gate insulating film), examples of which include films of hafnium silicon oxide and of hafnium aluminum oxynitride.

Also in order to create the second light-emitting portions A2 and A2', the thickness of the pixel defining layers 7 is selected from a range of 10 nm to 75 nm. The thickness of the pixel defining layers 7 less than 10 nm is not desirable in view of the risk that the edges of the pixel electrodes 5 may not be coated to reliably prevent a short circuit between the pixel electrode 5 and the common electrode 11 as well as the risk of a short circuit resulting from damage to the insulating films or tunnel current. On the other hand, the thickness of the pixel defining layers 7 exceeding 75 nm is not desirable either. For example, in the case where the pixel defining layers 7 are 100-nm thick silicon oxide layers, the second light-emitting portions A2 and A2' cannot be created.

<Banks 8>

The banks 8 are formed on the pixel defining layers 7 for the purpose of partitioning between the organic EL elements 20 adjacent in the X direction. The banks 8 are formed from an insulating organic material (such as acrylic-based resin, polyimide-based resin, and novolac type phenolic resin, for example) and at least the surface thereof is provided with repellency. The banks 8 are layers each having a liner shape elongated in the Y direction and disposed at an even pitch over a region corresponding to the gap between two pixel electrodes 5 adjacent in the X direction. As shown in FIG. 2B, the banks 8 each have a trapezoidal cross section and an equal width.

<Hole Transport Layer 9>

Each hole transport layer 9 is formed in the gap between two banks 8 adjacent in the X direction. The hole transport layers 9 are provided to facilitate injection of holes to the organic light-emitting layer 10. In the present embodiment, in order to create the second light-emitting portions A2 and A2', the material to be selected for the hole transport layers 9 has hole mobility that is at least $10^3$ times and at most $10^5$ times the hole mobility of the organic light-emitting layers 10. Examples of such a material include triarylamine-based compounds such as 4-4'-Bis [N-(naphthyl)-N-phenyl-amino] biphenyl (α-NPB or α-NPD), N,N'-Bis (3-methylphenyl)-(1,1'-biphenyl)-4,4'-diamine (TPD).

<Organic Light-Emitting Layers 10>

Each organic light-emitting layer 10 is formed over the hole transport layer 9 that is formed in the gap between two banks 8 adjacent in the X direction. The organic light-emitting layers 10 are where light emission as a result of recombination of carries takes place.

In each organic EL element 20R, the organic light-emitting layer 10 containing an organic material corresponding to the color R is formed. In each organic EL element 20G, the organic light-emitting layer 10 containing an organic material corresponding to the color G is formed. In each organic EL element 20B, the organic light-emitting layer 10 containing an organic material corresponding to the color B is formed. As described above, the materials of the organic light-emitting layers 10 are selected so that the hole mobility of the organic light-emitting layers 10 is at least $1/10^3$ and at most $1/10^5$ of the hole mobility of the hole transport layers.

Materials usable for the organic light-emitting layers 10 include polyparaphenylene vinylene (PPV), polyfluorene, and the following described in Japanese Patent Application Publication No. H5-163488, for example: fluorescent material, such as an oxinoid compound, perylene compound, coumarin compound, azacoumarin compound, oxazole compound, oxadiazole compound, perinone-compound, pyrrolopyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of an 8-hydroxyquinoline compound, metal complex of a 2-bipyridine compound, complex of a Schiff base and a group three metal, metal complex of oxine, rare earth metal complex, etc.

Note that each region denoted by "B1" in FIG. 2A is a region where no pixel electrode 5 is formed and thus corresponds to a non-light emitting portion that does not emit light.

<Common Electrode 11>

The common electrode (cathode) 11 is formed over the organic light-emitting layers 10 to cover the entire surface thereof. Since the organic EL display panel 100 is a top emission type, the common electrode 11 is formed from a light-transmitting conducting material, such as ITO or IZO.

<Additional Matters>

Note that the pixel electrodes 5 are not the only layers conforming to the contact holes 13. In the region above each contact hole 13, the hole injection layer 6, the pixel defining layer 7, the hole transport layer 9, the organic light-emitting layer 10, and the common electrode 11 also conform to the contact hole 13. As a result, a concavity 15 is formed above each contact hole 13.

A sealing layer is formed on the common electrode 11 to prevent the organic light-emitting layers 10 from deteriorating due to exposure to water, air, and so on. Since the organic EL display panel 100 is a top emission type, the sealing layer is formed from a light-transmitting material such as SiN and SiON.

[Principles of how Second Light-Emitting Portions A2 and A2' are Created]

The second light-emitting portions are created by selecting suitable materials and so on for the pixel defining layers 7, the hole transport layers 9, and the organic light-emitting layers 10 so as to satisfy all of the following three conditions. The three conditions are: (1) the relative dielectric constant of the pixel defining layers 7 is at least 3.8; (2) the thickness of the pixel defining layers 7 is at least 10 nm and at most 75 nm; and (3) the hole mobility of the hole transport layers 9 is at least $10^3$ times and at most $10^5$ times the hole mobility of the organic light-emitting layers 10.

Figure 3A:
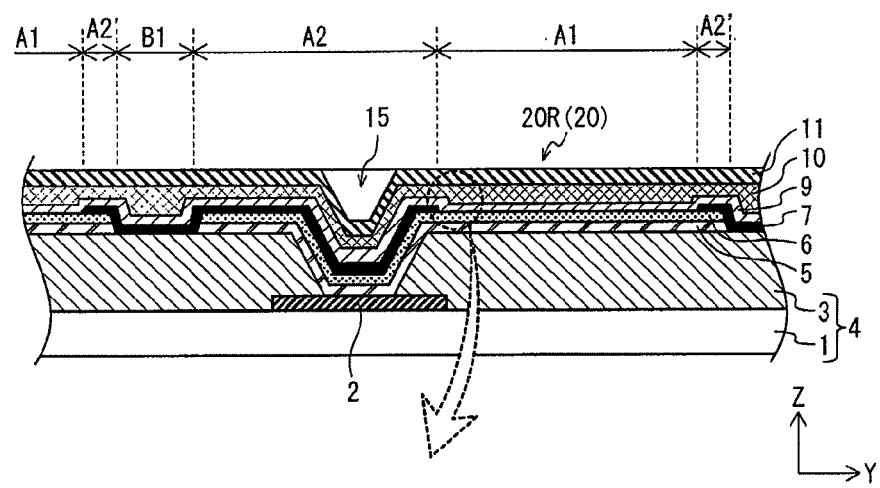
FIGS. 3A and 3B are views illustrating the principles of how the second light-emitting portions are created.
Figure 3B:
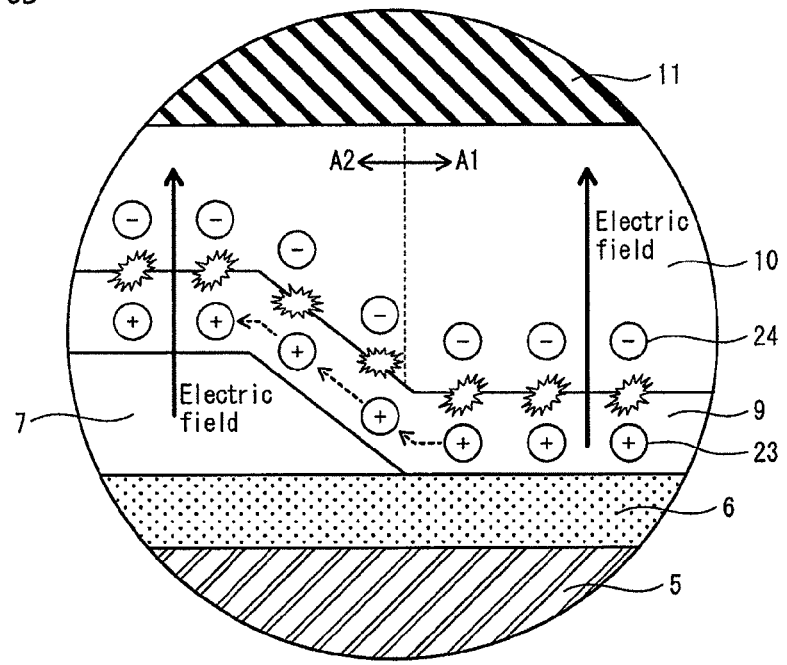

FIGS. 3A and 3B are views illustrating the principles of how the second light-emitting portions A2 and A2' are created. FIG. 3A shows a portion of the Y-Z cross section shown in FIG. 2A (A-A' cross section shown in FIG. 1), and FIG. 3B is a schematic enlarged view of the portion encircled by a broken line in FIG. 3A.

When electric current flows between the pixel electrode 5 and the common electrode 11, electric fields occur as indicated by solid arrows shown in FIG. 3B, in the pixel defining layer 7, the hole transport layer 9, and the organic light-emitting layer 10 that are located between the two electrodes. Note that the hole transport layer 9 is formed from a material having a hole mobility that is at least $10^3$ times and at most $10^5$ times the hole mobility of the organic light-emitting layer 10 (condition (3) described above). As holes 23 move more easily in the hole transport layer 9 than in the organic light-emitting layer 10, some of the holes 23 present in the hole transport layer 9 are allowed to move up into a region above the pixel defining layer 7 as indicated by dashed arrows shown in FIG. 3B. In the case where the condition (3) is not met, it is more difficult for holes present in the hole transport layer 9 to move up into a region above the pixel defining layer 7. As a consequence, no second light-emitting portion is created.

Although the second light-emitting portion A2' is not illustrated in FIG. 3A, the same principles applies to the second light-emitting portion A2'.

Experiments (Charge Recombination)

FIGS. 4A-5C are views each showing a simulation result of distribution of charge recombination in the respective layers of the organic EL display panel 100. As for the relation between the different hatch patterns in the figures and the amount of recombination of charges, the explanatory legends shown at the bottom of FIG. 4C and FIG. 5C should be referenced.

It is known that an organic EL element releases most of the energy resulting from recombination of holes and electrons in the form of light. Consequently, there is a strong correlation between the amount of recombination of charges and the amount of light emitted by the organic light-emitting layer. The following description is given on the assumption that the amount of recombination of charges is equal to the amount of light emitted by the organic light-emitting layer 10.

FIGS. 4A-4C show the simulation results on the organic EL display panel 100 in the cases where the thickness of the organic light-emitting layer 7 at a location above the pixel defining layer 7 is equal to that at a location above the pixel electrode 5. FIGS. 5A-5C show the simulation results on the organic EL display panel 100 in the cases where the organic light-emitting layer 7 has a flat upper surface. That is, the thickness of the organic light-emitting layer 10 at a location above the pixel defining layer 7 is different from that at a location above the pixel electrode 5. In comparison with FIGS. 5A-5C, the organic light-emitting layers 10 shown in FIGS. 4A-4C are generally thicker. In all of FIGS. 4A-5C, the thickness of the organic light-emitting layer 10 at a location above the pixel electrode 5 is 80 nm. Yet, the thickness of the organic light-emitting layer 10 at a location above the pixel defining layer 7 is 70 nm in FIG. 5A, 60 nm in FIG. 5B, and 50 nm in FIG. 5C.

Note, in addition, that the thickness of the pixel defining layer 7 is 10 nm in FIGS. 4A and 5A, 20 nm in FIGS. 4B and 5B, and 30 nm in FIGS. 4C and 5C. In FIGS. 4A, 4B, and 4C, the thickness of the organic light-emitting layer 10 is all equal. On the other hand, in the region above the pixel defining layer 7, the thickness of the common electrode 11 is smaller in proportion to the thickness of the pixel defining layer 7. In FIGS. 5A, 5B, and 5C, the thickness of the common electrode 11 is all equal, whereas the thickness of the organic light-emitting layer 10 in the region above the pixel defining layer 7 is smaller in proportion to the thickness of the pixel defining layer 7.

FIGS. 4A-5C show that light emission near the interface between the hole transport layer 9 and the organic light-emitting layer 10 is relatively intense not only in the region above the pixel electrode 5 (i.e., in the region where the pixel defining layer 7 is not present and thus the hole transport layer 9 is directly on the pixel electrode 5) but also in the region above the pixel defining layer 7. This indicates that holes move into the hole transport layer 9 in a region above the pixel defining layer 7 and that consequent recombination of carries occurs actively at the interface between the hole transport layer 9 and the organic light-emitting layer 10.

Comparison between FIGS. 4A-4C and FIGS. 5A-5C reveals the following. That is, in a region above the pixel defining layer 7, light emission near the interface between the hole transport layer 9 and the organic light-emitting layer 10 is more intense in FIGS. 5A-5C each showing the simulation result on the thinner organic light-emitting layer 10. In addition, the intense light-emission area is wider in FIGS. 5A-5C. This trend is also seen from comparison among FIGS. 5A, 5B, and 5C each showing the organic light-emitting layer 10 of a different thickness. This is believed to be because a thinner organic light-emitting layer 10 enables larger electric fields to be generated when an electric current flows between the pixel electrode and the common electrode. Consequently, in a region above the pixel defining layer 7, active recombination of carriers takes place near the interface between the hole transport layer 9 and the organic light-emitting layer 10.

In addition, the following is reveled from comparison among FIGS. 4A, 4B, and 4C in which the thickness of the organic light-emitting layers 10 is all equal, while the thickness of the pixel defining layer 7 is mutually different. That is, in a region near the slanted surface of the pixel defining layer 7 (in the region encircled by a broken line in each of FIGS. 4A, 4B, and 4C), light emission near the interface between the hole transport layer 9 and the organic light-emitting layer 10 is more intense in the simulation result on a thicker pixel defining layer 7. It means that recombination of carriers occurs more actively as the pixel defining layer 7 is thicker. This is believed to be because in a region near the slanted surface of the pixel defining layer 7, electric fields having a slanting direction are generated between the pixel electrode 5 and the common electrode 11, although the only direction of electric fields that are usually generated is a vertical direction between the pixel electrode 5 and the common electrode 11.

Comparison among FIGS. 5A, 5B, and 5C also reveals that in a region above the pixel defining layer 7, light emission near the interface between the hole transport layer 9 and the organic light-emitting layer 10 is more intense in the simulation result on a thicker pixel defining layer 7. It is noted that, in FIGS. 5A, 5B, and 5C, the thickness of the organic light-emitting layer 10 is reduced as the thickness of the pixel defining layer 7 increases. Therefore, the difference in light-emission intensities among FIGS. 5A, 5B, and 5C is affected not only by the thickness of the pixel defining layer 7 but also by the thickness of the organic light-emitting layer 10.

The grounds for believing that light emission occurs near the interface between the hole transport layer 9 and the organic light-emitting layer 10 in a region above the pixel defining layer 7 are as follows. The amount of recombination in the region corresponding to the second light-emitting portion is comparable to the amount of recombination in the region corresponding to the first light-emitting portion, which is a conventionally acknowledged light-emitting portion. That is, the amount of recombination observed near the interface between the hole transport layer 9 and the organic light-emitting layer 10 is comparable between a region above the pixel electrode 5 and a region above the pixel defining layer 7.

Here, the second light-emitting portions A2 and A2' are determined to have been formed when the amount of light emission from the organic light-emitting layer 10 in a region above both the pixel electrode 5 and the pixel defining layer 7 is at least 1/10 of the amount of light emission from the first light-emitting portion A1. The following describes the details of this determination.

FIG. 6 is a view showing a simulation result of distribution of charge recombination in layers of an organic EL display panel of a comparative example.

In this organic EL display panel of the comparative example, the hole mobility of the hole transport layer 9 is $10^2$ times the hole mobility of the organic light-emitting layer 10. In short, FIG. 6 shows the distribution of charge recombination in the respective layers of an organic EL display panel in which no second light-emitting portion is present.

The simulation result on the comparative example shows that, in a region above the pixel defining layer 7, light emission near the interface between the hole transport layer 9 and the organic light-emitting layer 10 increases as long as the distance from the region above the pixel electrode 5 is relatively short. Therefore, light emission occurs at such a location. However, even in the region above the pixel defining layer 7, the amount of light emission decreases when the distance from the region above the pixel electrode 5 is relatively long. Therefore, no light emission occurs at such a location. This is believed to be because holes cannot move throughout the hole transport layer 9 located on the pixel defining layer 7 when the hole mobility of the hole transport layer 9 is $10^2$ times the hole mobility of the organic light-emitting layer 10.

From the simulation results, the amount of light emitted from the organic light-emitting layer 10 at a location relatively distant from the region above the pixel electrode 5 is at most about 1/10 of that at a location relatively close to the region above the pixel electrode 5. Therefore, it is reasonable to determine that the second light-emitting portions A2 and A2' are present when the amount of light emission from the organic light-emitting layer 10 in a region above both the pixel electrode 5 and the pixel defining layer 7 is at least 1/10 of the amount of light emission from the first light-emitting portion A1.

(Light Emission Experiments)

FIGS. 7A-7E are views showing results of light emission experiments conducted on different test panels with pixel-defining layers 7 of different thicknesses.

FIGS. 7A, 7B, 7C, 7D, and 7E show the results obtained on the pixel defining layers 7 having the thicknesses of 25 nm, 50 nm, 75 nm, 100 nm, and 300 nm, respectively. FIGS. 7A, 7B, and 7C are directed to the pixel defining layer 7 with a thickness falling within a range of the present invention, whereas FIGS. 7D and 7E are directed to comparative examples. In addition, the reference sign R in the figures denotes a red organic EL element, G denotes a green organic EL element, and B denotes a blue organic EL element.

The structure of each test panel is the same as that shown in FIG. 2. The material and thickness of the respective layers of all the test panels are common, except those for the pixel defining layer 7. More specifically, the pixel electrodes were made from aluminum and the thickness thereof was 200 nm. The hole injection layers 6 were made from ITO and the thickness thereof was 50 nm. The hole transport layers 9 were made from N,N,N',N'-tetraphenyl-diaminoazobenzene (TPB) and the thickness thereof was 50 nm. The organic light-emitting layers 10 were made from polyparaphenylene vinylene (PPV) and the thickness thereof was 100 nm. The common electrodes were made of a laminate of barium and ITO and the thickness thereof was 50 nm.

The panels according to the present invention shown in FIGS. 7A, 7B, and 7C exhibited light emission in a larger surface area than that observed in comparative examples shown in FIGS. 7D and 7E, although emission of light at the regions corresponding to the contact holes (concavities) was rather weak.

In FIG. 7C, a portion encircled by a broken line is shown in enlargement. In the enlarged portion, regions denoted by A1, A2, A2' and B1 respectively correspond to the first light-emitting portion A1, the second light-emitting portions A2 and A2', and the non-light emitting portion B1.

[Method for Manufacturing Organic EL Display Pane 100]

Figure 9:
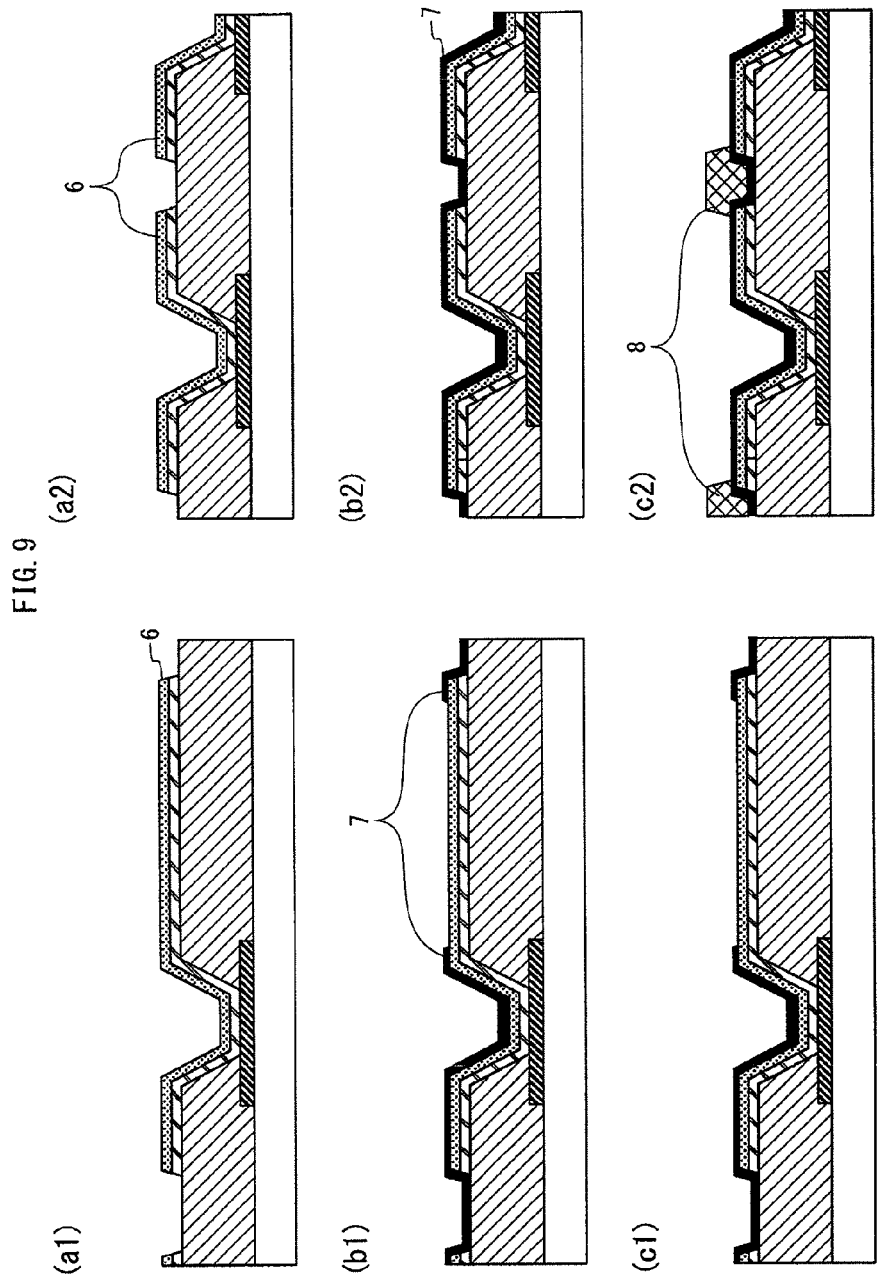
FIG. 9 is a view showing the one exemplary manufacturing method for the organic EL display panel 100.
Figure 10:
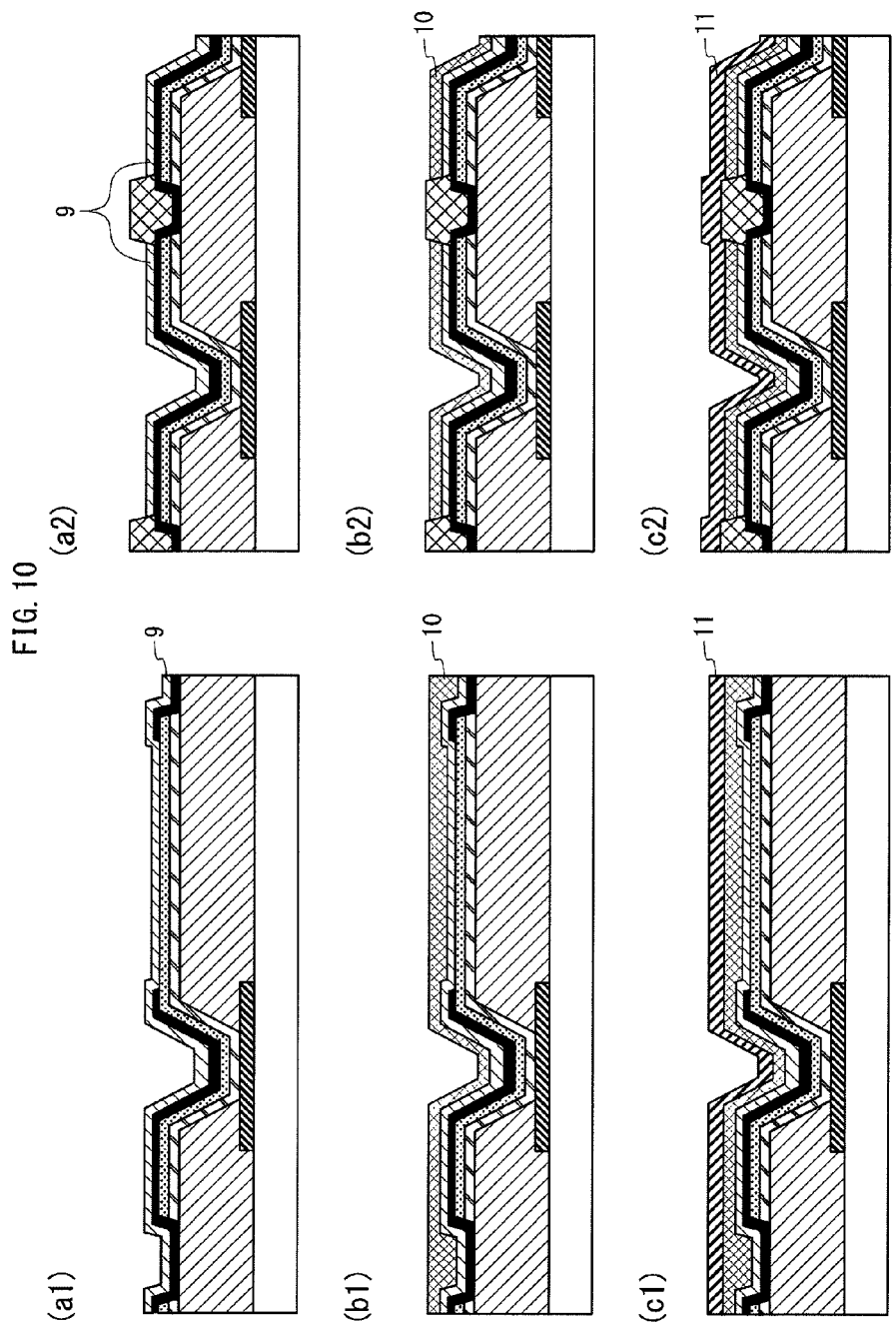
FIG. 10 is a view showing the one exemplary manufacturing method for the organic EL display panel 100.
Figure 11:
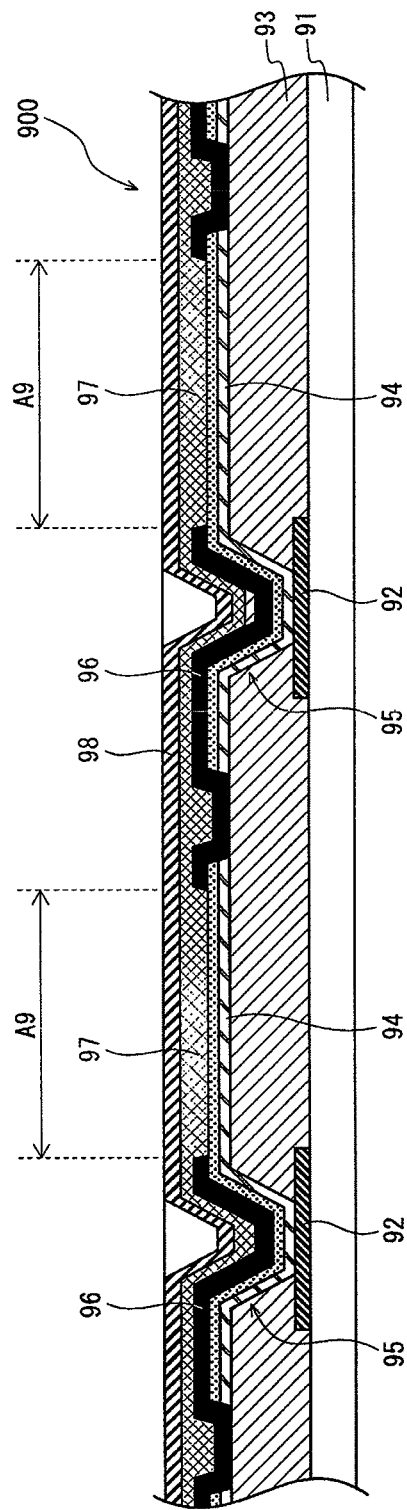
FIG. 11 is a schematic sectional view showing the structure of an organic EL display panel 900 having banks formed by a typical line-bank method.

FIGS. 8-10 are views showing one exemplary method for manufacturing the organic EL display panel 100. In FIGS. 8-10, (a1), (b1), (c1) show part of the A-A' cross section (Y-Z cross section) shown in FIG. 1, whereas (a2), (b2), and (c2) show part of the B-B' cross section (Z-X cross section) shown in FIG. 1.

First, a substrate 1 was prepared and placed in the chamber of a sputtering film forming apparatus. A predetermined sputter gas is introduced into the chamber, and via reactive sputtering, SD electrodes 2 are formed as shown in FIGS. 8 (a1) and (a2).

Then, a film of a photosensitive organic material (for example, a photosensitive polyimide based on siloxane copolymer) is formed by a spin coating method or the like to a thickness of 4 μm or so to coat the SD electrodes 2. This layer of the photosensitive organic material is then patterned by performing photolithography using a pattern mask. As a result, the interlayer insulation film 3 having contact holes 13 is formed as shown in FIGS. 8 (b1) and (b2).

Note the opening of the contact hole 13 is formed in accordance with the shape of the opening in the pattern mask. Therefore, adjusting the shape of the opening in the pattern mask consequently adjusts the shape of the opening of the contact hole 13. The inclination of the inner circumferential surface of the contact hole 13 can also be adjusted by using a half-tone mask as a pattern mask.

The following describes an alternative method for forming the interlayer insulation film 3. First, an insulating material film is formed from a material for an interlayer insulation film across the entire upper surface of the substrate 1. Then, a photoresist is applied on the insulating material film, and a pattern mask matching the contact holes to be formed is overlaid on the photoresist. Next, a resist pattern is formed by shining light of a predetermined wavelength, to which the material in the photoresist is sensitive, on the photoresist from above the pattern mask and then applying a developing solution. Subsequently, excess interlayer insulation film material and unhardened photoresist is washed off with an aqueous or non-aqueous etchant (release agent). Then, the residual photoresist is removed by washing with pure water. This completes the interlayer insulation film 3 having the contact holes 13.

Next, the pixel electrodes 5 are formed (FIGS. 8 (c1) and (c2)). More specifically, a film of metal material is formed by sputtering on the interlayer insulation film 3 to a thickness of 50-400 nm, followed by patterning by wet etching. Since the pixel electrodes 5 formed in this step are formed along the inner surface of the contact holes 13, the pixel electrodes 5 are partly concave and thus in electrical contact with the SD electrode 2.

Next, a layer of a predetermined metal oxide is formed on each pixel electrode 5 by reactive sputtering method, and then the metal oxide layer is patterned by performing photolithography and wet etching. As a result, the hole injection layers 6 are formed (FIGS. 9 (a1) and (a2)).

An insulating material layer is formed by CVD (Chemical Vapor Deposition) from SiO, SiN, SiON, hafnium silicon oxide, hafnium aluminium oxynitride, or the like. In this embodiment, in order to ensure that the second light-emitting portions A2 and A2' are created, the insulating material layer is formed to a thickness within a range of 10 nm and 75 nm. The insulating material layer thus formed is patterned by dry etching. As a result, the pixel defining layers 7 are formed (FIGS. 9 (b1) and (b2)).

Next, resist material is applied on the interlayer insulation film 3 and patterned by photolithography to form the banks 8 (FIGS. 9 (c1) and (c2)). The resist material is, for example, a photoresist or a resist material containing fluorine-based or acrylic material. Note that banks 8 are not visible in FIG. 9 (c1).

Note that, during the step of forming the banks 8, the surface of the bank 8 may be treated with an alkaline solution, water, or an organic solvent, or by plasma treatment, in order to provide the surface of the bank 8 with repellency or to adjust the angle of the bank 8 with respect to ink (that is for forming hole transport layers or for forming organic light-emitting layers) to be applied in a subsequent step.

Next, the hole transport layers 9 are formed by the wet method (FIGS. 10 (a1) and (a2)). More specifically, the organic material for the hole transport layers is mixed with solvent at a predetermined ratio to manufacture an ink for hole transport layers. This ink is then applied into the gaps between adjacent banks 8 by the inkjet method. Then, the solvent contained in the ink is evaporated thereby to form the hole transport layers 9.

Next, the organic light-emitting layers 10 are formed by the wet method as with the hole transport layers 9 (FIGS. 10 (b1) and (b2)). First, the organic material for the organic light-emitting layer 10 is mixed with solvent at a predetermined ratio to manufacture an ink for organic light-emitting layers 10. This ink is then applied on the upper surface of the hole transport layers 9 formed in the gaps between adjacent banks 8 by the inkjet method. Then, the solvent contained in the ink is evaporated thereby to form the organic light-emitting layers 10. Note that the organic material mixed into the ink for forming the organic light-emitting layers is different for each emission color.

Here, it should be noted that the method for applying the ink for hole transport layers as well as the method for applying the organic light-emitting layers is not limited to the inkjet method mentioned above. Instead of the inkjet method, the dispenser method, the nozzle coating method, the spin coating method, the intaglio printing, or the relief printing method may be used.

Next, the common electrode 11 is formed by depositing a film of ITO, IZO, or the like across the entire surface of the organic light-emitting layer 10 by the vacuum vapor disposition method (FIGS. 10 (c1) and (c2)). Finally, the sealing layer is formed by depositing a film of light-transmitting material such as SiN or SiON by a vacuum vapor disposition method to coat the common electrode 11.

Through the above steps, the organic EL display panel 100 is manufactured.

[Modifications and Supplemental]

Up to this point, the embodiment of the present invention has been described. However, the present invention is not limited to the specific embodiment described above. For example, various modifications including the following fall within the scope of the present invention.

(1) The hole injection layers formed on the pixel electrodes are not essential components of the present invention. The present invention is applicable to an organic EL display panel not provided with hole injection layers.

(2) The contact holes shown in FIG. 1 are circular truncated cones, wherein the inner surface is in a forward tapered shape so that the top (opening) of each contact hole 13 has a larger diameter than the bottom. Alternatively, the contact holes 13 may be formed in a circular cylindrical shape, wherein the top diameter and the bottom diameter are of the same size The shape of the bottom of the contact holes may also of course be a shape other than a circle, such as an ellipse, a rectangle, etc.

(3) The above-described manufacturing method for the organic EL display panel is merely one example. For example, the layer described to be formed by a vacuum film forming method may instead be formed by an application method such as an inkjet method. Conversely, the layer described to be formed by an inkjet method may instead be formed by a vacuum film forming method, for example.

(4) In the embodiment described above, the organic EL display panel is a top-emission type having a display surface on the side where the common electrode is disposed. However, the present invention is not limited in this way. The organic EL display panel may be a bottom emission type having a display surface on the side where the pixel electrodes are disposed. In addition, the organic EL display panel may be a dual emission type which emits light from both the side where the common electrode is disposed and the side where the pixel electrodes are disposed.

(5) The materials, numerals, and other specifics described in the above embodiment are merely preferable examples and without limitation. Various alternations may be made without departing from the technical concept of the present invention. It is to be noted that, in each of the accompanying figures, the relation between sizes of each of the members are not illustrated directly reflecting the actual relation. Note, in addition, that when a numerical range is indicated in the present disclosure, both the upper and lower limits are included in the numerical range.

INDUSTRIAL APPLICABILITY

The organic EL display panel or the like according to the present invention is suitably applicable to organic EL display panels and the like, which are used for various display devices for household use, for use in public facilities, and for professional use as well as TV apparatuses and displays for portable electronic devices, and etc.

REFERENCE SIGNS LIST 1 substrate
2 SD electrode
3 interlayer insulation film
4 TFT substrate
5 pixel electrode (anode)
6 hole injection layer
7 pixel defining layer
8 bank
9 hole transport layer
10 organic light-emitting layer
11 common electrode (cathode)
13 contact hole
15 concavity
20, 20R, 20G, 20B organic EL element (sub-pixel)
23 hole
24 electron
100 organic EL display panel
A1 first light-emitting portion
A2, A2' second light-emitting portion
B1 non-light-emitting portion
900 organic EL display panel
91 substrate
92 SD electrode
93 interlayer insulation film
94 pixel electrode
95 contact hole
96 pixel defining layer
97 organic light-emitting layer
98 common electrode

The invention claimed is:

1. An organic EL display panel comprising:
a substrate;
a plurality of pixel electrodes arranged in rows and columns over the substrate;
an insulating film elongated in a row direction over the pixel electrodes, the insulating film having a portion recessed to coat edges of pixel electrodes adjacent in a column direction, the edges facing each other in the column direction;
a plurality of banks each elongated in the column direction over a region corresponding to a gap between pixel electrodes adjacent in the row direction;
a hole transport layer disposed above the pixel electrodes, and entirely above an upper surface of the insulating film in a gap between the banks;
an organic light-emitting layer disposed over the hole transport layer in the gap between the banks; and
a common electrode disposed over the organic light-emitting layer, wherein
a dielectric constant of the insulating film is at least 3.8,
the insulating film measures at least 10nm and at most 75nm in the thickness,
a hole mobility of the hole transport layer is at least $10^3$ times and at most $10^5$ times a hole mobility of the organic light-emitting layer, and
light is emitted from a first light-emitting portion and a second light-emitting portion of the light-emitting layer,
the first light-emitting portion being above the pixel electrodes excluding where the insulating film is disposed, and
the second light-emitting portion, with respect to a vertical direction, being above and vertically aligned with both the pixel electrodes and the insulating film, and
wherein a cross-sectional shape of each of the light emitting layer, the pixel electrodes, and the hole transport layer conforms to and to and extends across a width of a cross-sectional shape of a contact hole formed in an interlayer insulating film of the substrate so as to define a cavity above the contact hole.

2. The organic EL display panel according to claim 1, wherein
the insulating film contains at least one selected from a group consisting of silicon oxide, silicon nitride and silicon oxynitride.

3. The organic EL display panel according to claim 1, wherein
an amount of light emitted from the second light-emitting portion is at least 1/10 of an amount of light emitted from the first light-emitting portion.

4. The organic EL display panel according to claim 1, wherein the second light-emitting portion is thinner than the first light-emitting portion.

5. The organic EL display panel according to claim 1, wherein the insulating film contains at least one selected from a group consisting of hafnium silicon oxide and hafnium aluminum oxynitride.

* * * * *